(12) United States Patent
Matsubara

(10) Patent No.: US 8,437,058 B2
(45) Date of Patent: May 7, 2013

(54) COMPUTER GENERATED HOLOGRAM AND EXPOSURE APPARATUS TO SUPPRESS AN ILLUMINATION VARIATION AND LOSS IN LIGHT

(75) Inventor: Isao Matsubara, Tucson, AZ (US)

(73) Assignee: Canon Kabushiki Kaisha, Tokyo (JP)

( * ) Notice: Subject to any disclaimer, the term of this patent is extended or adjusted under 35 U.S.C. 154(b) by 490 days.

(21) Appl. No.: 12/682,598

(22) PCT Filed: Dec. 12, 2008

(86) PCT No.: PCT/JP2008/073136
§ 371 (c)(1),
(2), (4) Date: Apr. 12, 2010

(87) PCT Pub. No.: WO2009/084466
PCT Pub. Date: Jul. 9, 2009

(65) Prior Publication Data
US 2010/0220372 A1    Sep. 2, 2010

(30) Foreign Application Priority Data
Dec. 28, 2007   (JP) .................................. 2007-341122

(51) Int. Cl.
*G03H 1/08* (2006.01)

(52) U.S. Cl.
USPC ................................................ 359/9; 359/22

(58) Field of Classification Search .................. None
See application file for complete search history.

(56) References Cited

U.S. PATENT DOCUMENTS

| | | | |
|---|---|---|---|
| 6,424,436 B1 | 7/2002 | Yamanaka | |
| 7,265,816 B2 | 9/2007 | Tsuji | |
| 8,189,248 B2 * | 5/2012 | Matsubara | ........................ 359/3 |
| 2005/0195480 A1 * | 9/2005 | Brown et al. | .................. 359/494 |
| 2006/0028957 A1 | 2/2006 | Kim | |

FOREIGN PATENT DOCUMENTS

| | | |
|---|---|---|
| JP | 2000-292617 A | 10/2000 |
| JP | 2002-022949 A | 1/2002 |
| JP | 2006-005319 A | 1/2006 |
| JP | 2006-049902 A | 2/2006 |
| JP | 2006-196715 A | 7/2006 |
| JP | 2008-170679 A | 7/2008 |

OTHER PUBLICATIONS

Michael A. Seldowitz, et al., "Synthesis of digital holograms by direct binary search", Applied Optics, vol. 26, No. 14, Jul. 15, 1987, pp. 2788-2798.

Fang Xu, et al., "Form-birefringent computer-generated holograms", Optics Letters, vol. 21, No. 18, Sep. 15, 1996, pp. 1513-1515.

(Continued)

*Primary Examiner* — Arnel C Lavarias
(74) *Attorney, Agent, or Firm* — Fitzpatrick, Cella, Harper & Scinto

(57) ABSTRACT

A present invention provides a computer generated hologram which forms a light intensity distribution on a predetermined plane by giving a phase distribution to a wavefront of incident light, the hologram including a first anisotropic cell and second anisotropic cell configured to change a polarization state of the incident light, and a first isotropic cell and second isotropic cell configured not to change the polarization state of the incident light, wherein a direction of an optic axis of the first anisotropic cell is different from a direction of an optic axis of the second anisotropic cell, and a thickness of the first isotropic cell is different from a thickness of the second isotropic cell.

8 Claims, 10 Drawing Sheets

OTHER PUBLICATIONS

Feb. 24, 2009 International Search Report and Written Opinion in International Patent Appln. No. PCT/JP2008/073136.

Yu, Wanji, et al., "Polarization-multiplexed diffractive optical elements fabricated by subwavelength structures," Applied Optics, Jan. 1, 2002, vol. 41, No. 1, pp. 96-100.

Xu, Fang, et al., "Polarization-selective computer-generated holograms: design, fabrication, and applications," Applied Optics, Jan. 10, 1995, vol. 34, No. 2, pp. 256-266.

European Patent Office, Extended European Search Report, May 11, 2011 (issued in counterpart European patent application No. 08867663.0-2205).

* cited by examiner

COMPUTER GENERATED HOLOGRAM AND EXPOSURE APPARATUS TO SUPPRESS AN ILLUMINATION VARIATION AND LOSS IN LIGHT

TECHNICAL FIELD

The present invention relates to a computer generated hologram and an exposure apparatus.

BACKGROUND ART

A projection exposure apparatus has conventionally been employed to fabricate a micropatterned semiconductor device such as a semiconductor memory or logic circuit by using photolithography (printing). The projection exposure apparatus projects and transfers a circuit pattern formed on a reticle (mask) onto a substrate such as a wafer via a projection optical system.

A resolution R of the projection exposure apparatus is given by:

$$R = k_1 \times \frac{\lambda}{NA} \quad (1)$$

where $\lambda$ is the exposure light wavelength, NA is the numerical aperture of the projection optical system, and $k_1$ is a process constant determined by, e.g., a development process.

The shorter the exposure light wavelength or the higher the NA of the projection optical system, the better the resolution. However, it is difficult to further shorten the current exposure light wavelength because the transmittance of a general glass material decreases as the exposure light wavelength shortens. It is also difficult to further increase the NA of the projection optical system available at present because the depth of focus decreases in inverse proportion to the second power of the NA of the projection optical system, and because it is hard to design and manufacture lenses to form a high-NA projection optical system.

Under the circumstances, there have been proposed resolution enhanced technologies (RETs) of improving the resolution by decreasing the process constant $k_1$. One of these RETs is the so-called modified illumination method (or oblique illumination method).

The modified illumination method generally inserts an aperture stop, which has a light-shielding plate on the optical axis of an optical system, in the vicinity of the exit surface of an optical integrator which forms a uniform surface light source, thereby obliquely irradiating a reticle with exposure light. The modified illumination method includes, for example, an annular illumination method and quadrupole illumination method that are different in the aperture shape of an aperture stop (i.e., the shape of the light intensity distribution). There has also been proposed another modified illumination method which uses a computer generated hologram (CGH) in place of an aperture stop, in order to improve the use efficiency (illumination efficiency) of the exposure light.

Along with an increase in the NA of the projection optical system, a polarized illumination method which controls the polarization state of exposure light is also becoming necessary to increase the resolution of the projection exposure apparatus. The polarized illumination method basically illuminates a reticle with not P-polarized light but S-polarized light alone, which has a component in the circumferential direction of concentric circles about the optical axis.

In recent years, there has been proposed a technique which exploits both the modified illumination method (the formation of a light intensity distribution having a desired shape (for example, a quadrupolar shape)) and the polarized illumination method (polarization state control).

For example, Japanese Patent Laid-Open No. 2006-196715 discloses a technique which implements both the modified illumination method and polarized illumination method using one element. Japanese Patent Laid-Open No. 2006-196715 controls the shape (reproduced image) of the light intensity distribution using a CGH, and controls the polarization state using form birefringence. More specifically, this technique forms one CGH by parallelly arranging a plurality of CGHs (to be referred to as "sub-CGHs" hereinafter) corresponding to light beams in the same polarization direction, and applies form birefringence corresponding to the polarization direction to each sub-CGH.

Japanese Patent Laid-Open No. 2006-49902 selectively uses a desired polarization mode by adopting a polarization controller as a unit for controlling polarization modes applied to a sub-CGH.

Japanese Patent Laid-Open No. 2006-5319 discloses a technique which can control the balance among four poles of a quadrupolar light intensity distribution typically formed by the modified illumination method and polarized illumination method. More specifically, Japanese Patent Laid-Open No. 2006-5319 forms sub-CGHs by dividing a CGH into four, and changes the intensity distribution of the incident light, thereby making it possible to change the pole balance of the reproduced image obtained by the CGH.

A technique associated with the design of a CGH has also been proposed in "Synthesis of digital holograms by direct binary search", APPLIED OPTICS, Vol. 26, No. 14, July 1987, 2788-2798.

However, the prior arts form sub-CGHs by dividing one CGH into a plurality of CGHs, so an illuminance variation occurs in the reproduced image if the optical integrator cannot sufficiently correct the intensity distribution of the incident light (for example, if the light impinges on only some of these CGHs).

When a plurality of sub-CGHs are combined, unnecessary diffracted light is generated due to structural discontinuity that occurs at the boundary between the sub-CGHs, resulting in deterioration in the reproduced image obtained by the CGH. The structural discontinuity that occurs at the boundary between the sub-CGHs can be eliminated by improving the design of a computer generated hologram, but this poses another problem that the design cost increases enormously.

When the polarization modes are selectively used by the polarization controller, the use efficiency (illumination efficiency) of the exposure light decreases significantly (i.e., a loss in light amount increases).

A general CGH is designed as an infinitely thin element using Fourier transformation. Therefore, an element thinner than ever is always required to design and manufacture a CGH.

DISCLOSURE OF INVENTION

The present invention provides a computer generated hologram which can suppress an illuminance variation and a loss in light amount and achieve a structure thinner than ever, thus forming a light intensity distribution (reproduced image) with a desired shape and polarization state.

According to one aspect of the present invention, there is provided a computer generated hologram which forms a light intensity distribution on a predetermined plane by giving a phase distribution to a wavefront of incident light, the hologram comprising a first anisotropic cell and second anisotropic cell configured to change a polarization state of the incident light, and a first isotropic cell and second isotropic cell configured not to change the polarization state of the incident light, wherein a direction of an optic axis of the first anisotropic cell is different from a direction of an optic axis of the second anisotropic cell, and a thickness of the first isotropic cell is different from a thickness of the second isotropic cell.

According to another aspect of the present invention, there is provided an exposure apparatus comprising an illumination optical system configured to illuminate a reticle with light from a light source; and a projection optical system configured to project a pattern of the reticle onto a substrate, the illumination optical system including a computer generated hologram, wherein the computer generated hologram includes a computer generated hologram configured to form a light intensity distribution on a predetermined plane by giving a phase distribution to a wavefront of incident light, the computer generated hologram includes a first anisotropic cell and second anisotropic cell configured to change a polarization state of the incident light, and a first isotropic cell and second isotropic cell configured not to change the polarization state of the incident light, a direction of an optic axis of the first anisotropic cell is different from a direction of an optic axis of the second anisotropic cell, and a thickness of the first isotropic cell is different from a thickness of the second isotropic cell.

Further features of the present invention will become apparent from the following description of exemplary embodiments with reference to the attached drawings.

BEST MODE FOR CARRYING OUT THE INVENTION

Figure 1:
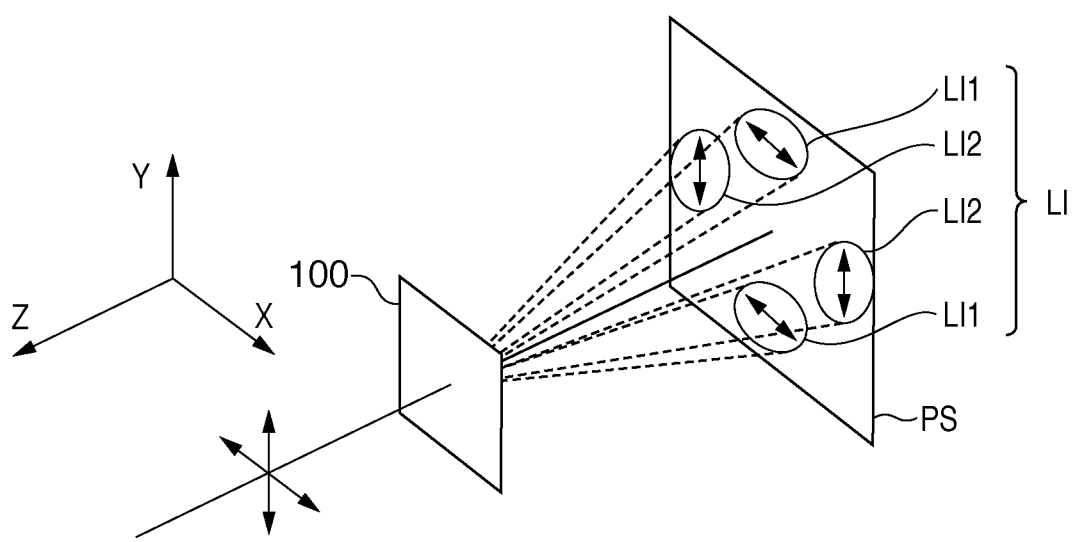
FIG. 1 is a view for explaining a computer generated hologram according to one aspect of the present invention.

A preferred embodiment of the present invention will be described below with reference to the accompanying drawings. The same reference numerals denote the same members throughout the drawings, and a repetitive description thereof will not be given.

FIG. 1 is a view for explaining a computer generated hologram 100 according to one aspect of the present invention. As shown in FIG. 1, the computer generated hologram 100 forms a light intensity distribution (reproduced image) LI on a predetermined plane PS (for example, at the aperture position) by giving a phase distribution to the wavefront of the incident light. The computer generated hologram 100 gives different phase distributions to the wavefront of X-polarized light serving as linearly polarized light in a first direction (linearly polarized light whose polarization direction is the X-axis direction), and that of Y-polarized light serving as linearly polarized light in a second direction (linearly polarized light whose polarization direction is the Y-axis direction). This makes it possible to make a first light intensity distribution $LI_1$ formed by X-polarized light (a linearly polarized light component in the X-axis direction of the incident light) different from a second light intensity distribution $LI_2$ formed by Y-polarized light (a linearly polarized light component in the Y-axis direction of the incident light). Note that the polarization directions of the X-polarized light and Y-polarized light are orthogonal to each other.

Figure 2:
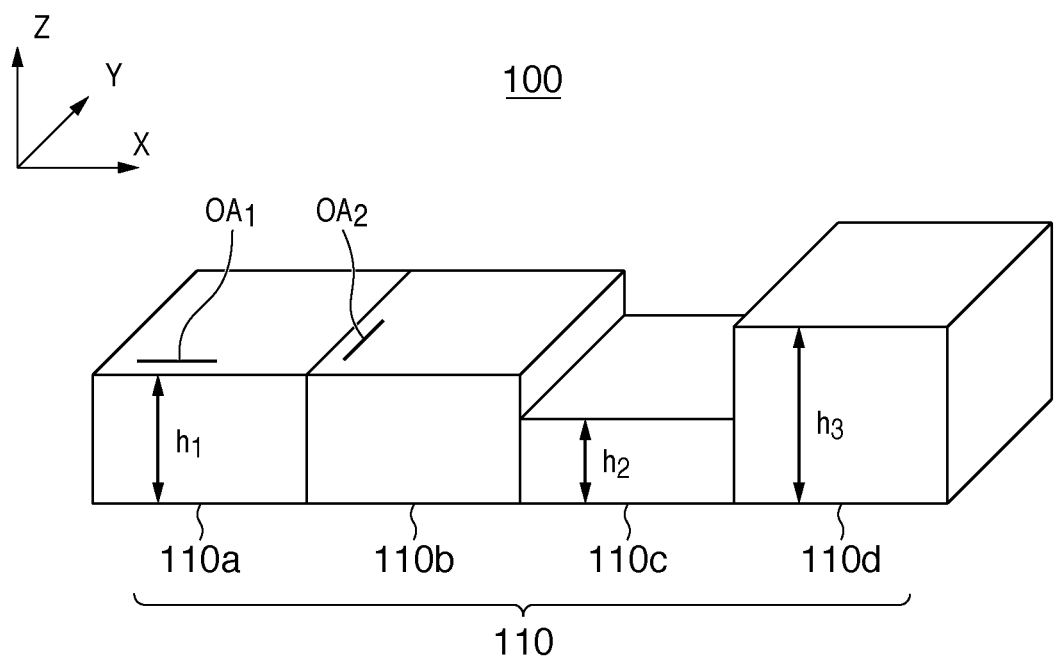
FIG. 2 is a schematic perspective view showing a cell structure which forms the computer generated hologram shown in FIG. 1.

The computer generated hologram 100 which gives different phase distributions to the wavefronts of X-polarized light and Y-polarized light will be explained in detail below. FIG. 2 is a schematic perspective view showing a cell structure which forms the computer generated hologram 100. As shown in FIG. 2, the computer generated hologram 100 includes a plurality of rectangular cells 110.

To give different phase distributions to the wavefronts of X-polarized light and Y-polarized light, the computer generated hologram 100 must independently control the wavefronts in the respective polarization directions. For example, if the computer generated hologram 100 has two steps, it is necessary to give binary phases to the wavefronts in the two polarization directions. For this purpose, the cells 110 of the computer generated hologram 100 must have cell structures of four types. Each of cells 110a to 110d shown in FIG. 2 has a cell structure of one of these four types. The computer generated hologram 100 is formed by arraying cells 110 of four types in a tetragonal lattice pattern.

As shown in FIG. 2, the plurality of cells 110 include a first anisotropic cell 110a and second anisotropic cell 110b which change the polarization state of the incident light, and a first isotropic cell 110c and second isotropic cell 110d which do not change the polarization state of the incident light. That the first isotropic cell 110c and second isotropic cell 110d do not change the polarization state of the incident light means herein that they do not change the polarization state of the incident light compared to the first anisotropic cell 110a and second anisotropic cell 110b. For this reason, this embodiment assumes that a cell in which the difference between their refractive indices with respect to X-polarized light and Y-polarized light is 0 (inclusive) to 0.001 (inclusive) is an isotropic cell.

The first anisotropic cell 110a and second anisotropic cell 110b are configured such that the direction of an optic axis $OA_1$ of the first anisotropic cell 110a is different from that of an optic axis $OA_2$ of the second anisotropic cell 110b. This makes it possible to attain a cell which advances the wavefront of X-polarized light from that of Y-polarized light, and a cell which retards the wavefront of X-polarized light from that of Y-polarized light. Also, in this embodiment, the first anisotropic cell 110a and second anisotropic cell 110b are configured such that the direction of the optic axis $OA_1$ of the first anisotropic cell 110a intersects at right angles with that of the optic axis $OA_2$ of the second anisotropic cell 110b in correspondence with X-polarized light and Y-polarized light. In other words, the direction of the optic axis $OA_1$ of the first anisotropic cell 110a is perpendicular to that of the optic axis $OA_2$ of the second anisotropic cell 110b. The optic axis means herein an axis along a direction in which, because the refractive index is constant in the anisotropic medium, no birefringence occurs even if non-polarized light impinges on the anisotropic cell so that ordinary and extraordinary rays match each other or have a minimum deviation if any.

The first isotropic cell 110c and second isotropic cell 110d are configured such that a thickness (the thickness in the Z direction) $h_2$ of the first isotropic cell 110c is different from a thickness (the thickness in the Z direction) $h_3$ of the second isotropic cell 110d. This makes it possible to attain a cell which advances the wavefronts of both X-polarized light and Y-polarize light, and a cell which retards the wavefronts of both X-polarized light and Y-polarized light.

Thicknesses (the thicknesses in the Z direction) $h_1$ of the first anisotropic cell 110a and second anisotropic cell 110b, the thickness $h_2$ of the first isotropic cell 110c, and the thickness $h_3$ of the second isotropic cell 110d can be represented by using the following three refractive indices (first to third refractive indices). The first refractive indices are a refractive index $n_E$ of the first anisotropic cell 110a with respect to X-polarized light, and a refractive index $n_E$ of the second anisotropic cell 110b with respect to Y-polarized light. The second refractive indices are a refractive index $n_O$ of the first anisotropic cell 110a with respect to Y-polarized light, and a refractive index $n_O$ of the second anisotropic cell 110b with respect to X-polarized light. The third refractive indices are refractive indices n of the first isotropic cell 110c and second isotropic cell 110d. For the sake of simplicity, this embodiment exemplifies a case in which $n_O > n_E$.

To configure a two-step computer generated hologram 100, a phase shift of $\pi$ is necessary. To attain this state, the thicknesses $h_1$ of the first anisotropic cell 110a and second anisotropic cell 110b need only satisfy:

$$h_1 = \frac{1}{2} \frac{\lambda}{n_O - n_E} \quad (2)$$

To form a wavefront matching the one obtained at the refractive index $n_E$ of the first anisotropic cell 110a with respect to X-polarized light and the refractive index $n_E$ of the second anisotropic cell 110b with respect to Y-polarized light, the thickness $h_2$ of the first isotropic cell 110c need only satisfy:

$$h_2 = \frac{n_E - 1}{n - 1} h_1 \quad (3)$$

Also, to form a wavefront matching the one obtained at the refractive index $n_O$ of the first anisotropic cell 110a with respect to Y-polarized light and the refractive index $n_O$ of the second anisotropic cell 110b with respect to X-polarized light, the thickness $h_3$ of the second isotropic cell 110d need only satisfy:

$$h_3 = \frac{n_O - 1}{n - 1} h_1 \quad (4)$$

This embodiment has exemplified a case in which $n_O > n_E$ as described above. If $n_O < n_E$, $n_E$ and $n_O$ in equations (2), (3) and (4) need only be interchanged.

The plurality of cells 110 include a multiple of steps (a plurality of regions having different thicknesses) attributed to the thicknesses $h_1$ of the first anisotropic cell 110a and second anisotropic cell 110b, the thickness $h_2$ of the first isotropic cell 110c, and the thickness $h_3$ of the second isotropic cell 110d, as shown in FIG. 2. A case in which the first anisotropic cell 110a and second anisotropic cell 110b are made of anisotropic materials, and $n_O = 1.6$, $n_E = 1.4$, and $n = 1.5$ will be exemplified as a concrete numerical example. In this case, letting $\lambda$ be the wavelength of the incident light, the thicknesses $h_1$ of the first anisotropic cell 110a and second anisotropic cell 110b, the thickness $h_2$ of the first isotropic cell 110c, and the thickness $h_3$ of the second isotropic cell 110d are $2.5\lambda$, $2\lambda$, and $3\lambda$, respectively. In this manner, the thicknesses $h_1$ of the first anisotropic cell 110a and second anisotropic cell 110b, the thickness $h_2$ of the first isotropic cell 110c, and the thickness $h_3$ of the second isotropic cell 110d fall within few multiples of the wavelength $\lambda$. These values are realistic as the thicknesses of the cells of a computer generated hologram.

A case in which an excimer laser such as an ArF excimer laser with a wavelength of about 193 nm or a KrF excimer laser with a wavelength of about 248 nm is used as a light source of a projection exposure apparatus will be considered. In this case, a polarization-direction-dependent difference in refractive index $\Delta n$ of an anisotropic material which can be used for the anisotropic cell is relatively small. More specifically, a polarization-direction-dependent difference in refractive index $\Delta n$ of magnesium fluoride used as a wave plate of an ArF excimer laser is 0.014 for a wavelength of about 193 nm. Therefore, the thicknesses $h_1$ of the first anisotropic cell 110a and second anisotropic cell 110b are about $36\lambda$ from equation (2).

Figure 3:
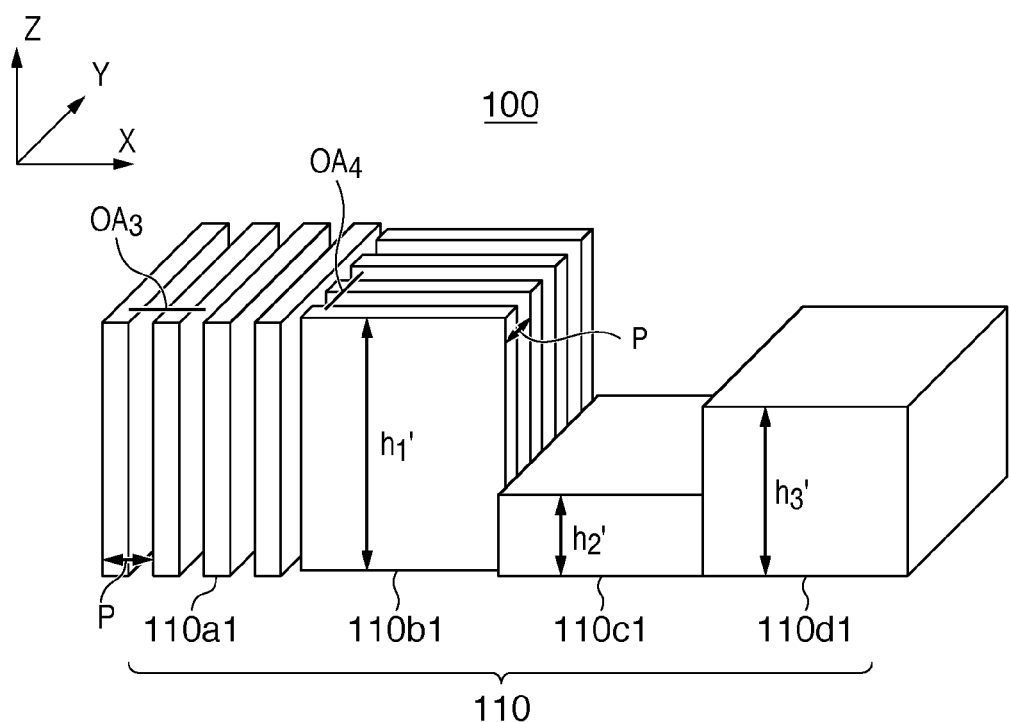
FIG. 3 is a schematic perspective view showing another cell structure which forms the computer generated hologram shown in FIG. 1.

FIG. 3 is a schematic perspective view showing another cell structure which forms the computer generated hologram 100. As shown in FIG. 3, the computer generated hologram 100 includes a plurality of cells 110. As will be described later, the cell structure of the computer generated hologram 100 shown in FIG. 3 can be formed to be thinner than that of the computer generated hologram 100 shown in FIG. 2, thus achieving a further decrease in the thickness of the computer generated hologram 100.

As shown in FIG. 3, the plurality of cells 110 include a first anisotropic cell 110a1 and second anisotropic cell 110b1 which change the polarization state of the incident light, and a first isotropic cell 110c1 and second isotropic cell 110d1 which do not change the polarization state of the incident light.

Each of the first anisotropic cell 110a1 and second anisotropic cell 110b1 is formed from a diffraction grating which generates form birefringence, and, for example, is formed from a one-dimensional diffraction grating having a periodic structure with a pitch P smaller than the wavelength of the incident light in order to prevent the generation of diffracted light components of orders other than the 0th order. As shown in FIG. 3, the direction of the pitch of the periodic structure of the first anisotropic cell 110a1 is identical to the direction of an optic axis $OA_3$ of the first anisotropic cell 110a1, and that of the second anisotropic cell 110b1 is identical to the direction of an optic axis $OA_4$ of the second anisotropic cell 110b1.

Also, the first anisotropic cell 110a1 and second anisotropic cell 110b1 are configured such that the direction of the optic axis $OA_3$ of the first anisotropic cell 110a1 is different from that of the optic axis $OA_4$ of the second anisotropic cell 110b1. In other words, the first anisotropic cell 110a1 and second anisotropic cell 110b1 are configured such that the direction of the pitch of the periodic structure of the first anisotropic cell 110a1 is different from that of the second anisotropic cell 110b1. This makes it possible to attain a cell which advances the wavefront of X-polarized light from that of Y-polarized light, and a cell which retards the wavefront of X-polarized light from that of Y-polarized light. Japanese Patent Laid-Open No. 2006-196715 discloses a diffraction grating made of quartz as an example of the diffraction grating which generates form birefringence. According to Japanese Patent Laid-Open No. 2006-196715, when quartz has a refractive index of 1.56 with respect to a wavelength of 193 nm, and the duty ratio of the diffraction grating in the form birefringence region is 1:1 (=0.5), a refractive index $n_\perp$ of the diffraction grating in the direction of the pitch is 1.19, and a refractive index $n_{//}$ of the diffraction grating in a direction perpendicular to the pitch is 1.31.

In this embodiment, the first anisotropic cell 110a1 and second anisotropic cell 110b1 are configured such that the direction of the pitch of the periodic structure of the first anisotropic cell 110a1 intersects at right angles with that of the second anisotropic cell 110b1 in correspondence with X-polarized light and Y-polarized light. In other words, the direction of the pitch of the periodic structure of the first anisotropic cell 110a1 is perpendicular to that of the second anisotropic cell 110b1. The optic axis $OA_3$ of the first anisotropic cell 110a1 can be said to be parallel to the X-axis, like the optic axis $OA_1$ of the first anisotropic cell 110a. The optic axis $OA_4$ of the second anisotropic cell 110b1 can be said to be parallel to the Y-axis, like the optic axis $OA_2$ of the second anisotropic cell 110b. Therefore, the first anisotropic cell 110a1 and second anisotropic cell 110b1 can be said to be configured such that the direction of the optic axis $OA_3$ of the first anisotropic cell 110a1 intersects at right angles with that of the optic axis $OA_4$ of the second anisotropic cell 110b1.

In addition, the first anisotropic cell 110a1 and second anisotropic cell 110b1 are configured such that the thickness of the first anisotropic cell 110a1 is equal to that of the second anisotropic cell 110b1. This makes it possible to advance and retard the wavefront of X-polarized light from that of Y-polarized light by a phase of π. In this embodiment, because the computer generated hologram 100 has two steps (i.e., generates a two-step wavefront), the anisotropic cells have only one thickness. If the computer generated hologram 100 has a multiple of steps more than two steps, a plurality of pairs of anisotropic cells having the same thickness and different optic axis directions are formed to have different thicknesses. In other words, a computer generated hologram of a multiple of steps more than two steps is formed from a plurality of anisotropic cell pairs which have different thicknesses and in which two anisotropic cells having different optic axis directions are paired.

Even when each of the first anisotropic cell 110a1 and second anisotropic cell 110b1 is formed from a diffraction grating which generates form birefringence, thicknesses $h_1'$ of the first anisotropic cell 110a1 and second anisotropic cell 110b1 need only satisfy equation (2) upon substituting $h_1'$ for $h_1$. Likewise, a thickness $h_2'$ of the first isotropic cell 110c1 need only satisfy equation (3) upon substituting $h_2'$ for $h_2$, and a thickness $h_3'$ of the second isotropic cell 110d1 need only satisfy equation (4) upon substituting $h_3'$ for $h_3$.

A case in which the first anisotropic cell 110a1 and second anisotropic cell 110b1 are made of quartz compatible with a wavelength λ=193 nm will be exemplified as a concrete numerical example. The refractive index of the quartz is assumed to be 1.56, a refractive index $n_\perp$ of the diffraction grating in the direction of the pitch is assumed to be 1.19, and a refractive index $n_{//}$ of the diffraction grating in a direction perpendicular to the pitch is assumed to be 1.31, as described above. To obtain the thicknesses $h_1'$ of the first anisotropic cell 110a1 and second anisotropic cell 110b1, the thickness $h_2'$ of the first isotropic cell 110c1, and the thickness $h_3'$ of the second isotropic cell 110d1 using equations (2) to (4), it is only necessary to substitute $n_\perp$ for $n_E$ and substitute $n_{//}$ for $n_O$. In this case, the thicknesses $h_1'$ of the first anisotropic cell 110a1 and second anisotropic cell 110b1 are 4.17λ from equation (2). This value is equal to the thickness of a λ/2 plate as one type of wave plates. From equations (3) and (4), the thickness $h_2'$ of the first isotropic cell 110c1 and the thickness $h_3'$ of the second isotropic cell 110d1 are 1.41λ and 2.31λ, respectively, that are smaller than the thicknesses $h_1'$ of the first anisotropic cell 110a1 and second anisotropic cell 110b1. In this manner, the thicknesses $h_1'$ of the first anisotropic cell 110a1 and second anisotropic cell 110b1, the thickness $h_2'$ of the first isotropic cell 110c1, and the thickness $h_3'$ of the second isotropic cell 110d1 fall within the thickness of the λ/2 plate. If the incident light for the λ/2 plate is linearly polarized light including X-polarized light and Y-polarized light, the λ/2 plate must have a thickness large enough to give a phase difference of π to the X-polarized light and Y-polarized light. When the thickness of the computer generated hologram 100 falls within that of the λ/2 plate, it is minimized. In other words, the computer generated hologram 100 shown in FIG. 3 is very thin. The thicknesses $h_1'$ ($h_1'$=4.17λ) of the first anisotropic cell 110a1 and second anisotropic cell 110b1 are smaller than the thicknesses $h_1$ of the first anisotropic cell 110a and second anisotropic cell 110b formed by using magnesium fluoride as the birefringent materials.

This embodiment has exemplified a two-step computer generated hologram, so the computer generated hologram 100 is formed from anisotropic cells having one thickness and isotropic cells having two thicknesses. However, the present invention is not particularly limited to a two-step computer generated hologram, and is applicable to a computer generated hologram of a multiple of steps more than two steps which is formed from anisotropic cells having more than one thickness, and isotropic cells having more than two thicknesses. In this embodiment, the one-dimensional diffraction grating is used as the diffraction grating which generates form birefringence, and a two-dimensional diffraction grating may be used.

Note that although this embodiment has exemplified only the cell structure of the computer generated hologram 100, it is hard to bond materials having different properties (for example, an anisotropic cell and isotropic cell), as shown in FIG. 2. Furthermore, if each anisotropic cell is formed from a diffraction grating which generates form birefringence, as shown in FIG. 3, the diffraction grating floats in the air, which is hard to maintain. In view of this, the above-described anisotropic cells and isotropic cells are formed on a substrate made of, for example, quartz in practice.

A detailed design example of the computer generated hologram 100 will be explained below.

Figure 4:
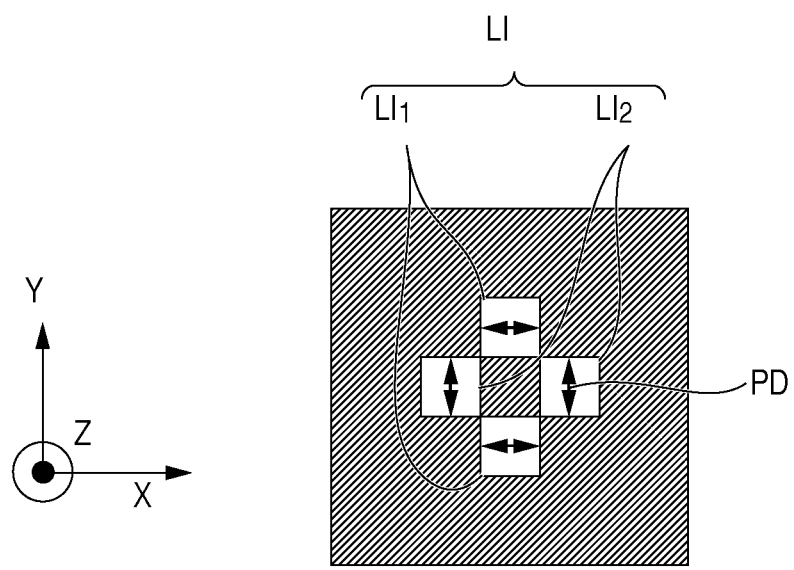
FIG. 4 is a view showing an example of a quadrupole light intensity distribution formed by the computer generated hologram shown in FIG. 1.

A case in which the computer generated hologram 100 forms a quadrupole light intensity distribution (target image) LI, as shown in FIG. 4, will be exemplified first. The light intensity distribution LI shown in FIG. 4 includes first light intensity distributions $LI_1$ formed by X-polarized light, and second light intensity distributions $LI_2$ formed by Y-polarized light. Polarization directions PD of the first light intensity distributions $LI_1$ and second light intensity distributions $LI_2$ match the circumferential direction of concentric circles (i.e., correspond to S-polarization). FIG. 4 is a view showing an example of the quadrupole light intensity distribution LI formed by the computer generated hologram 100.

Figure 5:
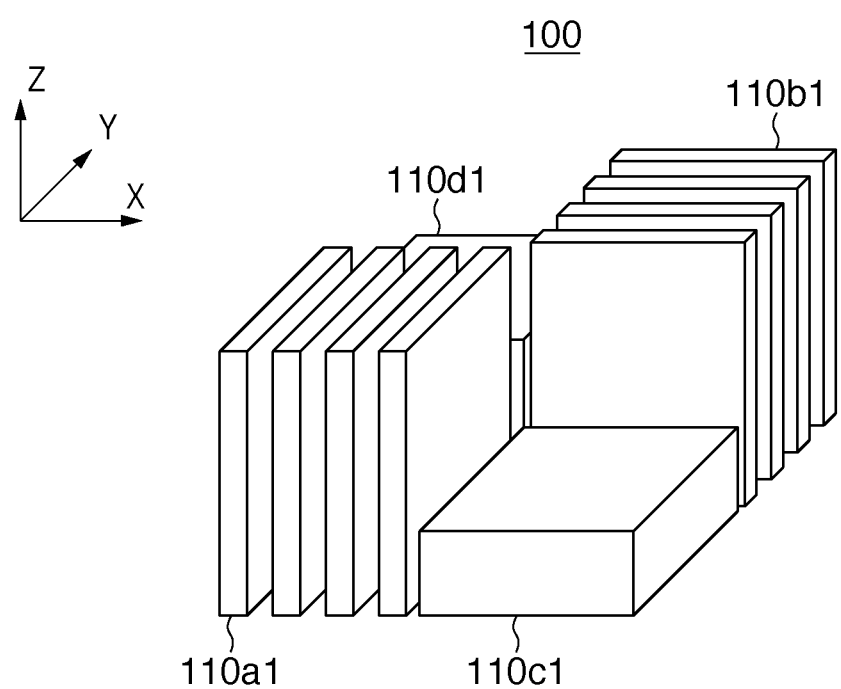
FIG. 5 is a schematic perspective view showing the structure of the computer generated hologram for forming the light intensity distribution shown in FIG. 4.

FIG. 5 is a schematic perspective view showing the structure of the computer generated hologram 100 for forming the light intensity distribution LI shown in FIG. 4. The computer generated hologram 100 for forming the light intensity distribution LI shown in FIG. 4 has the cell structure shown in FIG. 3, and includes a first anisotropic cell 110a1, second anisotropic cell 110b1, first isotropic cell 110c1, and second isotropic cell 110d1. In other words, the computer generated hologram 100 shown in FIG. 5 is formed by rearranging the cells of the cell structure of the computer generated hologram 100 shown in FIG. 3. FIG. 5 shows the basic structure (a structure of one period, which includes 2×2 cells) of the computer generated hologram 100 for forming the light intensity distribution LI shown in FIG. 4. However, in practice, the computer generated hologram 100 is formed by repeatedly arranging the basic structures in the X- and Y-axis directions.

Figure 6:
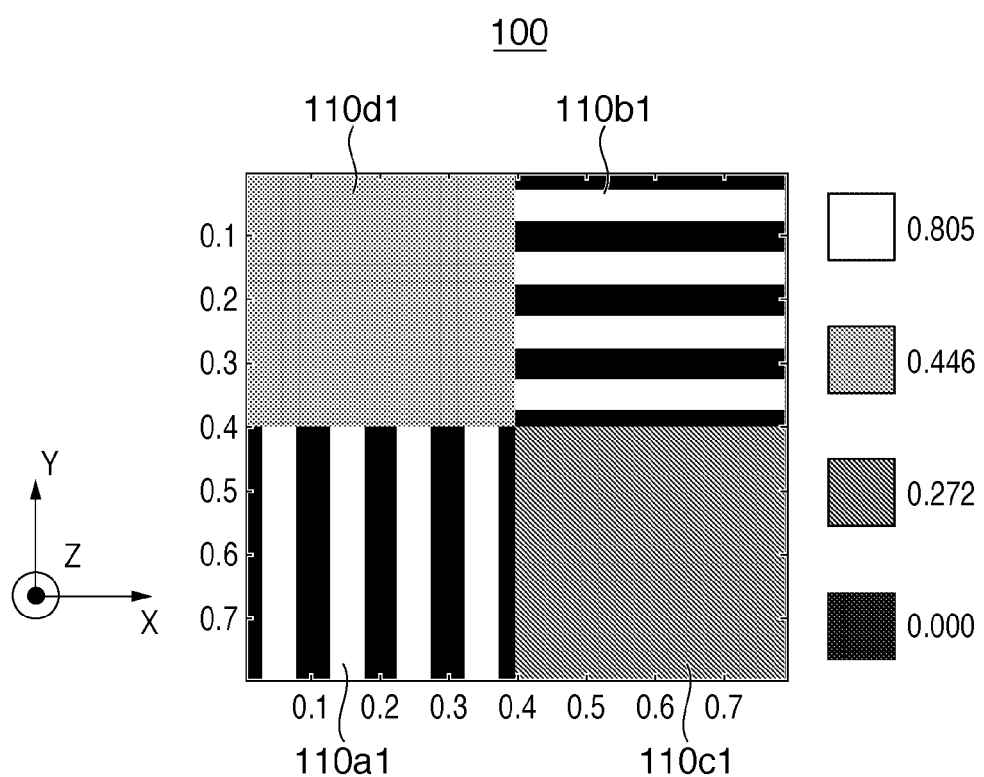
FIG. 6 is a chart showing the thickness of each cell of the computer generated hologram shown in FIG. 5.

FIG. 6 is a chart showing the thickness of each cell of the computer generated hologram 100 shown in FIG. 5. In FIG. 6, the density represents the thickness of each cell (in the Z direction). A color closer to white indicates a larger thickness, and that closer to black indicates a smaller thickness. The numerical values shown in FIG. 6 indicate the internal thicknesses of the first anisotropic cell 110a1 and second anisotropic cell 110b1, and the thicknesses of the first isotropic cell 110c1 and second isotropic cell 110d1 in the computer generated hologram 100 (unit: μm). Note that the numerical values shown in FIG. 6 exemplify a case in which the first anisotropic cell 110a1 and second anisotropic cell 110b1 are made of quartz having a refractive index of 1.56 with respect to a wavelength of 193 nm.

Referring to FIGS. 5 and 6, the computer generated hologram 100 for forming the light intensity distribution LI shown in FIG. 4 is configured such that cells that are π out of phase are vertically, alternately arranged along the Y-axis to diffract X-polarized light. Also, the computer generated hologram 100 is configured such that cells that are π out of phase are horizontally, alternately arranged along the X-axis to diffract Y-polarized light. With the computer generated hologram 100 having this arrangement shown in FIGS. 5 and 6, ±1st-order diffracted light components having a high intensity in the vertical direction along the Y-axis are obtained if X-polarized light impinges on the computer generated hologram 100, and ±1st-order diffracted light components having a high intensity in the horizontal direction along the X-axis are obtained if Y-polarized light impinges on the computer generated hologram 100. Hence, if light having a polarization state in which the intensity of X-polarized light is equal to that of Y-polarized light impinges on the computer generated hologram 100 shown in FIGS. 5 and 6, the intensity distribution of the light diffracted by the computer generated hologram 100 matches the light intensity distribution LI shown in FIG. 4.

Figure 7:
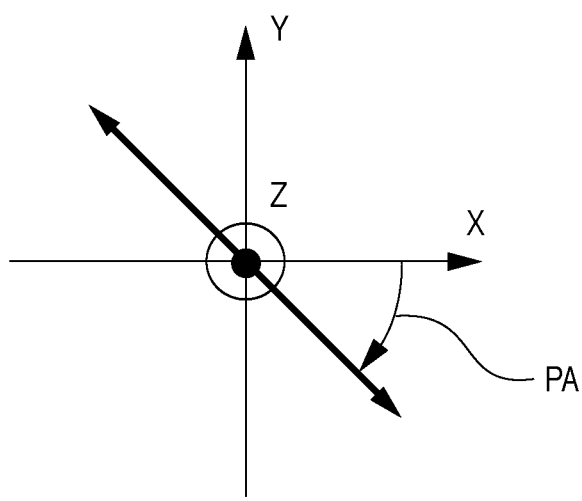
FIG. 7 is a diagram showing an example of light having a polarization state in which the intensity of X-polarized light is equal to that of Y-polarized light.

FIG. 7 is a diagram showing an example of the light having a polarization state in which the intensity of X-polarized light is equal to that of Y-polarized light. The light shown in FIG. 7 is linearly polarized light in which an angle PA of the polarization direction with respect to the X-axis is −45°. The computer generated hologram 100 forms the light intensity distribution LI shown in FIG. 4 by selecting the light shown in FIG. 7 as the incident light. However, if the target image is a light intensity distribution LI in which first light intensity distributions $LI_1$ formed by X-polarized light are completely separated from second light intensity distributions $LI_2$ formed by Y-polarized light, as shown in FIG. 4, light having another polarization state can be selected as the incident light. For example, the incident light may be linearly polarized light in which an angle PA of the polarization direction with respect to the X-axis is 45°. Alternatively, the incident light may be non-polarized light or circularly polarized light having a polarization state in which the intensity of X-polarized light is equal to that of Y-polarized light.

In this manner, according to this embodiment, it is possible to provide a computer generated hologram which has a thickness that falls within that of a λ/2 plate (i.e., which achieves a structure thinner than ever), and forms a quadrupole light intensity distribution by S-polarized light as an example of a light intensity distribution with a desired shape and polarization state.

Figure 8:
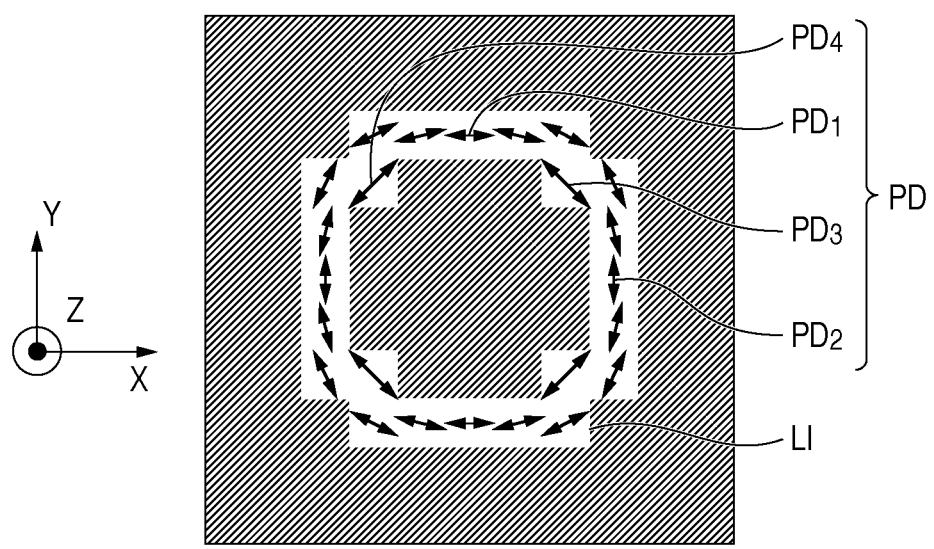
FIG. 8 is a view showing an example of an annular light intensity distribution formed by the computer generated hologram shown in FIG. 1.

A case in which the computer generated hologram 100 forms an annular light intensity distribution (target image) LI, as shown in FIG. 8, will be exemplified next. Polarization directions PD of the light intensity distribution LI shown in FIG. 8 include a plurality of polarization directions $PD_1$ to $PD_4$, and match the circumferential direction of concentric circles (i.e., correspond to S-polarization). FIG. 8 is a view showing an example of the annular light intensity distribution LI formed by the computer generated hologram 100.

Figure 9:
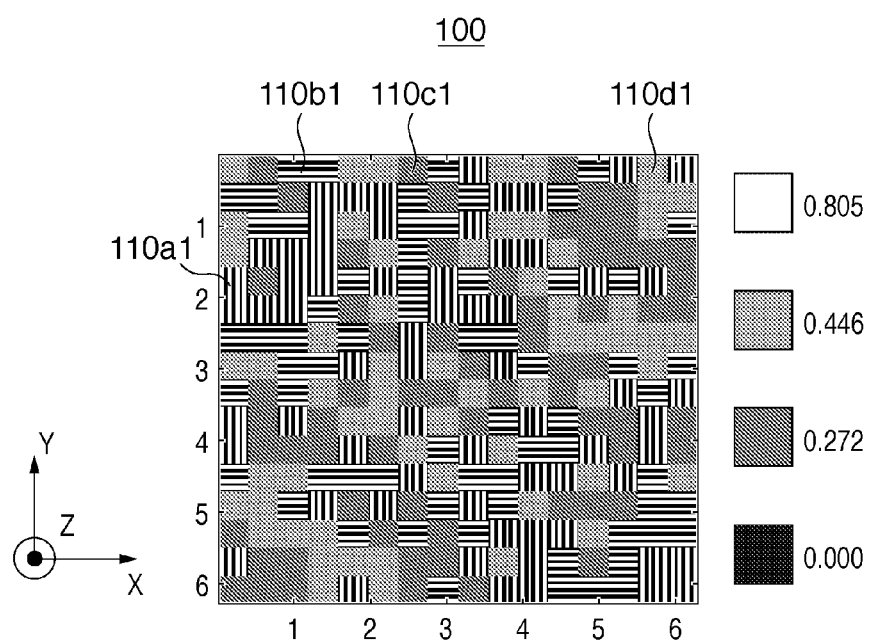
FIG. 9 is a chart showing the thickness of each cell of the computer generated hologram for forming the light intensity distribution shown in FIG. 8.

FIG. 9 is a chart showing the thickness of each cell of the computer generated hologram 100 for forming the light intensity distribution LI shown in FIG. 8. In FIG. 9, the density represents the thickness of each cell (in the Z direction). A color closer to white indicates a larger thickness, and that closer to black indicates a smaller thickness. The numerical values shown in FIG. 9 indicate the internal thicknesses of the first anisotropic cell 110a1 and second anisotropic cell 110b1, and the thicknesses of the first isotropic cell 110c1 and second isotropic cell 110d1 in the computer generated hologram 100 (unit: μm). Note that the numerical values shown in FIG. 9 exemplify a case in which the first anisotropic cell 110a1 and second anisotropic cell 110b1 are made of quartz having a refractive index of 1.56 with respect to a wavelength of 193 nm.

The computer generated hologram 100 for forming the light intensity distribution LI shown in FIG. 8 has the cell structure shown in FIG. 3, and includes a first anisotropic cell 110a1, second anisotropic cell 110b1, first isotropic cell 110c1, and second isotropic cell 110d1. In other words, the computer generated hologram 100 shown in FIG. 9 is formed by rearranging the cells of the cell structure of the computer generated hologram 100 shown in FIG. 3. FIG. 9 shows the basic structure (a structure of one period, which includes 16×16 cells) of the computer generated hologram 100 for forming the light intensity distribution LI shown in FIG. 8. However, in practice, the computer generated hologram 100 is formed by repeatedly arranging the basic structures in the X- and Y-axis directions.

Light intensity distributions formed by X-polarized light and Y-polarized light in the light intensity distribution LI shown in FIG. 8 are not completely separated, differently from the light intensity distribution LI shown in FIG. 4. In other words, the light intensity distribution LI shown in FIG. 8 includes linearly polarized light beams having oblique polarization directions $PD_3$ and $PD_4$, which are formed by both X-polarized light and Y-polarized light. For this reason, the polarization state of light which impinges on the computer generated hologram 100 shown in FIG. 9 for forming the light intensity distribution LI shown in FIG. 8 is limited. The computer generated hologram 100 shown in FIG. 9 forms the light intensity distribution LI shown in FIG. 8 when the incident light is linearly polarized light in which an angle PA of the polarization direction with respect to the X-axis is −45° (see FIG. 7). Although the incident light can also be circularly polarized light, it is necessary to change the thickness of each cell of the computer generated hologram 100 in that case.

In this manner, according to this embodiment, it is possible to provide a computer generated hologram which has a thickness that falls within that of a λ/2 plate (i.e., which achieves a structure thinner than ever), and forms an annular light intensity distribution by S-polarized light as an example of a light intensity distribution with a desired shape and polarization state.

Although this embodiment has exemplified a case in which the computer generated hologram includes few cells, a light intensity distribution with a desired shape and polarization state can be formed even by increasing the number of cells of the computer generated hologram. Increasing the number of cells of the computer generated hologram makes it possible to decrease the sizes of pixels which divide the light intensity distribution (target image), thus forming a uniform light intensity distribution.

Figure 10:
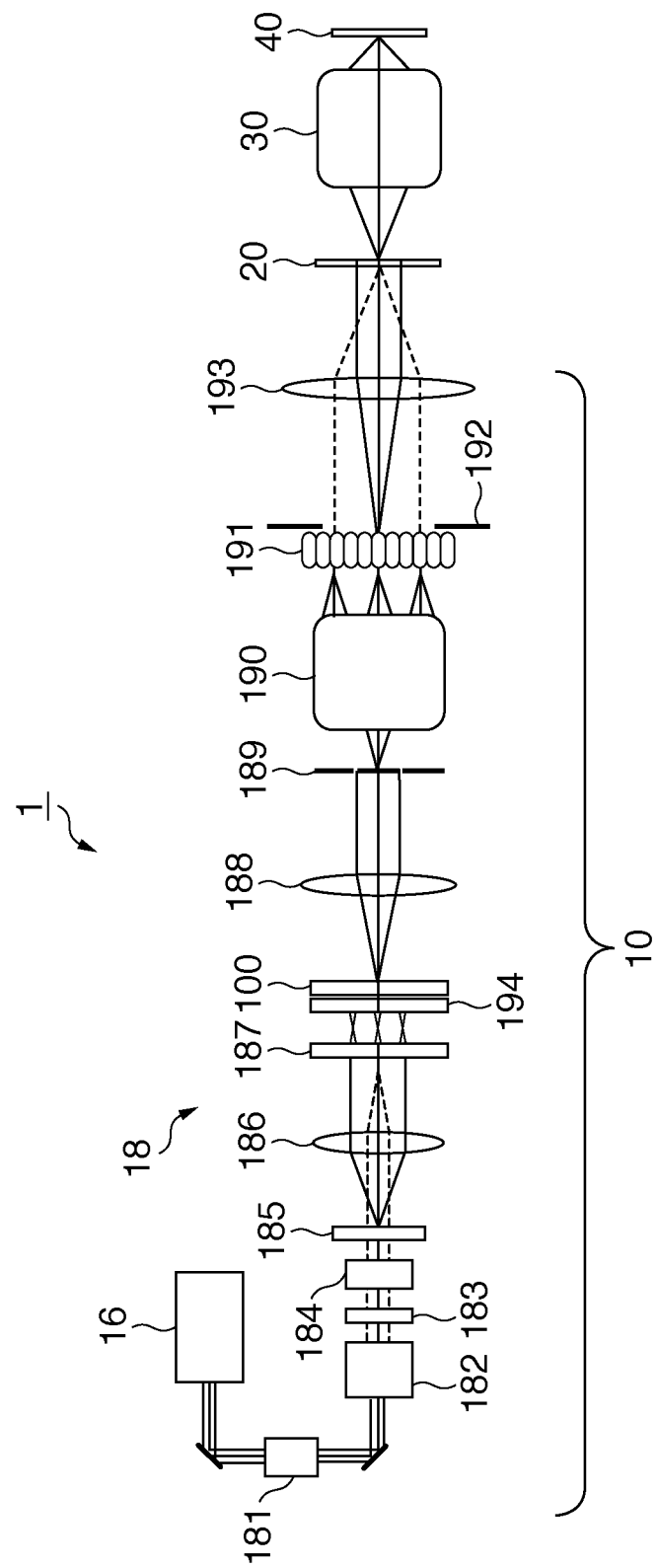
FIG. 10 is a view showing the arrangement of an exposure apparatus according to one aspect of the present invention.

An exposure apparatus 1 to which the computer generated hologram 100 according to the present invention is applied will be explained below with reference to FIG. 10. FIG. 10 is a view showing the arrangement of the exposure apparatus 1 according to one aspect of, the present invention.

In this embodiment, the exposure apparatus 1 is a projection exposure apparatus which transfers the pattern of a reticle 20 onto a wafer 40 by the step & scan scheme. However, the exposure apparatus 1 can adopt the step & repeat scheme or another exposure scheme.

As shown in FIG. 10, the exposure apparatus 1 includes an illumination apparatus 10, a reticle stage (not shown) for supporting the reticle 20, a projection optical system 30, and a wafer stage (not shown) for supporting the wafer 40.

The illumination apparatus 10 illuminates the reticle 20 on which a circuit pattern to be transferred is formed, and includes a light source 16 and illumination optical system 18.

The light source 16 is, for example, an excimer laser such as an ArF excimer laser with a wavelength of about 193 nm or a KrF excimer laser with a wavelength of about 248 nm. However, the light source 16 is not particularly limited to an excimer laser, and may be, e.g., an $F_2$ laser with a wavelength of about 157 nm or a mercury lamp with a narrow wavelength range.

The illumination optical system 18 illuminates the reticle 20 with light from the light source 16, and performs modified illumination on the reticle 20 in a predetermined polarization state while ensuring a predetermined illuminance in this embodiment. In this embodiment, the illumination optical system 18 includes a light extension optical system 181, beam shaping optical system 182, polarization controller 183, phase controller 184, exit angle saving optical element 185, relay optical system 186, multibeam generation unit 187, polarization state adjusting unit 194, and computer generated hologram 100. The illumination optical system 18 also includes a relay optical system 188, aperture 189, zoom optical system 190, multibeam generation unit 191, aperture stop 192, and irradiation unit 193.

The light extension optical system 181 deflects light from the light source 16 to guide it to the beam shaping optical system 182. The beam shaping optical system 182 shapes the section of the light from the light source 16 into a desired shape by converting the horizontal to vertical ratio of the section of the light from the light source 16 into a desired value (e.g., by changing the sectional shape from a rectangle to a square). The beam shaping optical system 182 forms a light beam with a size and an angle of divergence which are required to illuminate the multibeam generation unit 187.

The polarization controller 183 includes, e.g., a linear polarizer and has a function of removing unnecessary polarized light components. It is possible to efficiently convert light from the light source 16 into desired linearly polarized light by minimizing polarized light components removed (shielded) by the polarization controller 183.

The phase controller 184 converts the linearly polarized light obtained by the polarization controller 183 into circularly polarized light by giving a phase difference of λ/4 to it.

The exit angle saving optical element 185 includes, e.g., an optical integrator (e.g., a fly-eye lens or fiber bundle including a plurality of microlenses), and outputs the light at a predetermined angle of divergence.

The relay optical system 186 converges the light which emerges from the exit angle saving optical element 185 on the multibeam generation unit 187. The relay optical system 186 adjusts the exit surface of the exit angle saving optical element 185 and the incident surface of the multibeam generation unit 187 to hold the Fourier transform relationship (the relationship between the object plane and the pupil plane or that between the pupil plane and the image plane).

The multibeam generation unit 187 includes an optical integrator (e.g., a fly-eye lens or fiber bundle including a plurality of microlenses) for uniformly illuminating the polarization state adjusting unit 194 and computer generated hologram 100. The exit surface of the multibeam generation unit 187 forms a light source surface including a plurality of point light sources. The light which emerges from the multibeam generation unit 187 impinges on the polarization state adjusting unit 194 as circularly polarized light.

The polarization state adjusting unit 194 converts the circularly polarized light obtained by the phase controller 184 into linearly polarized light having a desired polarization direction by giving a phase difference of λ/4 to it. The light which emerges from the polarization state adjusting unit 194 impinges on the computer generated hologram 100 as linearly polarized light.

The computer generated hologram 100 forms a light intensity distribution (e.g., a light intensity distribution LI including light intensity distributions $LI_1$ and $LI_2$ formed by X-polarized light and Y-polarized light, respectively, as shown in FIG. 4) at the position of the aperture 189 via the relay optical system 188. The computer generated hologram 100 can take any of the above-described forms, and a detailed description thereof will not be given herein.

The aperture 189 has a function of passing only a light intensity distribution formed by the computer generated hologram 100. The computer generated hologram 100 and aperture 189 are set to hold the Fourier transform relationship.

The zoom optical system 190 enlarges a light intensity distribution formed by the computer generated hologram 100 at a predetermined magnification, and projects it onto the multibeam generation unit 191.

The multibeam generation unit 191 is inserted on the pupil plane of the illumination optical system 18, and forms, on its exit surface, a light source image (effective light source distribution) corresponding to the light intensity distribution formed at the position of the aperture 189. In this embodiment, the multibeam generation unit 191 includes an optical integrator such as a fly-eye lens or cylindrical lens array. The aperture stop 192 is inserted near the exit surface of the multibeam generation unit 191.

The irradiation unit 193 includes, e.g., a condenser optical system and illuminates the reticle 20 with an effective light source distribution formed on the exit surface of the multi-beam generation unit 191.

The reticle 20 has a circuit pattern and is supported and driven by the reticle stage (not shown). Diffracted light generated by the reticle 20 is projected onto the wafer 40 via the projection optical system 30. Since the exposure apparatus 1 is of the step & scan scheme, it transfers the pattern of the reticle 20 onto the wafer 40 by scanning them.

The projection optical system 30 projects the pattern of the reticle 20 onto the wafer 40. The projection optical system 30 can be a dioptric system, catadioptric system, or catoptric system.

The wafer 40 is a substrate onto which the pattern of the reticle 20 is projected (transferred), and is supported and driven by the wafer stage (not shown). However, it is also possible to use a glass plate or another substrate in place of the wafer 40. The wafer 40 is coated with a resist.

As described above, the computer generated hologram 100 does not give a phase distribution to the wavefront of light polarized in a single direction, but two-dimensionally gives different phase distributions to the wavefronts of both X-polarized light and Y-polarized light. This makes it possible to form a light intensity distribution LI almost without generating any loss in light amount.

In exposure, light emitted by the light source 16 illuminates the reticle 20 by the illumination optical system 18. The light which bears the information of the pattern of the reticle 20 forms an image on the wafer 40 by the projection optical system 30. The illumination optical system 18 used for the exposure apparatus 1 can suppress any illumination variation and loss in light amount, and form a light intensity distribution with a desired shape and polarization state by the computer generated hologram 100. Hence, the exposure apparatus 1 can provide high-quality devices (e.g., a semiconductor device, an LCD device, an image sensing device (e.g., a CCD), and a thin-film magnetic head) with a high throughput and a good economical efficiency.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-341122 filed on Dec. 28, 2007, which is hereby incorporated by reference herein in its entirety.

The invention claimed is:

1. A hologram which forms a light intensity distribution and a polarization distribution on a predetermined plane by giving a phase distribution to a wavefront of incident light, said hologram comprising:
a first anisotropic cell and second anisotropic cell configured to change a polarization state of the incident light; and
a first isotropic cell and second isotropic cell configured not to change the polarization state of the incident light,
wherein a direction of an optic axis of said first anisotropic cell is different from a direction of an optic axis of said second anisotropic cell,
a thickness of said first isotropic cell is different from a thickness of said second isotropic cell,
the thickness of said first isotropic cell is set so that a phase change of linearly polarized light in a first direction of the incident light is the same in said first isotropic cell and said first anisotropic cell, and
the thickness of said second isotropic cell is set so that a phase change of linearly polarized light in a second direction perpendicular to the first direction of the incident light is the same in said second isotropic cell and said first anisotropic cell.

2. The hologram according to claim 1, wherein a difference between a refractive index of each of said first isotropic cell and said second isotropic cell with respect to linearly polarized light in the first direction and a refractive index of each of said first isotropic cell and said second isotropic cell with respect to linearly polarized light in the second direction perpendicular to the first direction is 0 (inclusive) to 0.001 (inclusive).

3. The hologram according to claim 1, wherein each of said first anisotropic cell and said second anisotropic cell includes a diffraction grating which generates form birefringence.

4. The hologram according to claim 1, wherein each of said first anisotropic cell and said second anisotropic cell includes a diffraction grating having a periodic structure with a pitch smaller than a wavelength of the incident light,
a direction of the pitch of the periodic structure of said first anisotropic cell is identical to the direction of the optic axis of said first anisotropic cell, and
a direction of the pitch of the periodic structure of said second anisotropic cell is identical to the direction of the optic axis of said second anisotropic cell.

5. The hologram according to claim 4, wherein the direction of the pitch of the periodic structure of said first anisotropic cell is perpendicular to the direction of the pitch of the periodic structure of said second anisotropic cell.

6. The hologram according to claim 1, wherein a thickness of said first anisotropic cell is equal to a thickness of said second anisotropic cell.

7. The hologram according to claim 1, wherein the direction of the optic axis of said first anisotropic cell is perpendicular to the direction of the optic axis of said second anisotropic cell.

8. An exposure apparatus comprising:
an illumination optical system configured to illuminate a reticle with light from a light source; and
a projection optical system configured to project a pattern of the reticle onto a substrate,
said illumination optical system including a hologram,
wherein said hologram is configured to form a light intensity distribution and a polarization distribution on a predetermined plane by giving a phase distribution to a wavefront of incident light,
said hologram includes
a first anisotropic cell and second anisotropic cell configured to change a polarization state of the incident light, and
a first isotropic cell and second isotropic cell configured not to change the polarization state of the incident light,
a direction of an optic axis of said first anisotropic cell is different from a direction of an optic axis of said second anisotropic cell,
a thickness of said first isotropic cell is different from a thickness of said second isotropic cell,
the thickness of said first isotropic cell is set so that a phase change of linearly polarized light in a first direction of the incident light is the same in said first isotropic cell and said first anisotropic cell, and
the thickness of said second isotropic cell is set so that a phase change of linearly polarized light in a second direction perpendicular to the first direction of the incident light is the same in said second isotropic cell and said first anisotropic cell.

* * * * *